United States Patent [19]

Howk et al.

[11] 4,321,555
[45] Mar. 23, 1982

[54] UNIVERSAL FREQUENCY SYNTHESIZER

[75] Inventors: Max E. Howk, Franklin County; Gale E. Slentz; Ronald E. Grillot, both of Johnson County, all of Kans.

[73] Assignee: King Radio Corporation, Olathe, Kans.

[21] Appl. No.: 140,762

[22] Filed: Apr. 16, 1980

[51] Int. Cl.³ .............................................. H03L 7/00
[52] U.S. Cl. ...................................... 331/1 A; 331/16; 331/17; 331/18; 331/25
[58] Field of Search ...................... 324/1 A, 16, 17, 18, 324/25

[56] References Cited

U.S. PATENT DOCUMENTS

| | | | |
|---|---|---|---|
| 3,401,353 | 9/1968 | Hughes | 331/25 X |
| 3,611,175 | 10/1971 | Boelke | 331/17 X |
| 3,988,696 | 10/1976 | Sharpe | 331/1 A |
| 4,023,108 | 5/1977 | Torii | 331/1 A X |
| 4,068,198 | 1/1978 | Otto | 331/25 X |
| 4,151,473 | 4/1979 | Coleman et al. | 331/1 A X |
| 4,242,649 | 12/1980 | Washbrun, Jr. | 331/25 X |
| 4,246,547 | 1/1981 | Gerard et al. | 331/17 X |
| 4,280,104 | 7/1981 | Rzeszewski | 331/1 A |

*Primary Examiner*—Stanley T. Krawczewicz

*Attorney, Agent, or Firm*—Lowe, Kokjer, Kircher, Wharton & Bowman

[57] ABSTRACT

This invention relates in general to a universal frequency synthesizer which is suitable for use in a phase-locked loop frequency synthesizer system comprising a voltage controlled oscillator, a reference oscillator and a low pass filter. The universal frequency synthesizer of the present invention is basically comprised of programmable divider circuitry and a phase detector.

The universal frequency synthesizer is arranged to receive tuning data in serial format from an external source. The received tuning data is permanently stored within the universal frequency synthesizer and is used to establish the division ratio by which the output signal produced by the synthesizer's attendant voltage controlled oscillator and the reference signal produced by the synthesizer's attendant reference oscillator are divided before being provided to the signal and comparison inputs of the phase detector, respectively. In this way, the frequency of the output signal from the synthesizer's attendant voltage controlled oscillator may be changed by simply changing the tuning data stored with the device.

27 Claims, 6 Drawing Figures

UNIVERSAL FREQUENCY SYNTHESIZER

BACKGROUND AND BRIEF DESCRIPTION OF THE INVENTION

This invention relates in general to a universal frequency synthesizer comprising programmable divider circuitry and a phase detector. The universal frequency synthesizer of the present invention is suitable for use in combination with the conventional components of a phase-locked loop frequency synthesizer to produce a plurality of different frequency signals in response to tuning data provided to the universal frequency synthesizer external source.

The conventional phase-locked loop frequency synthesizer structure is basically comprised of a voltage controlled oscillator, a voltage controlled oscillator frequency divider, a phase detector, a reference oscillator, a reference oscillator frequency divider, and a low pass filter. These elements are interconnected to form a closed frequency feedback system. In operation, the voltage controlled oscillator produces an output signal having a frequency related to the voltage signal applied to the control input of this device. This output signal is then provided to a frequency divider whose output is an integral division of the input frequency and is provided to the phase detector where it is compared with a reference signal produced by the output of reference oscillator frequency divider whose input is the reference oscillator. The phase detector is operable to produce an error voltage that is a function of and proportional to the phase and frequency difference between these two signals. The error voltage is then filtered by the low pass filter before being applied to the control input of the voltage control oscillator. The voltage controlled oscillator responds to this filtered error voltage by varying the frequency of its output signal so as to reduce the detected difference in frequency between the compared signals. In this way, the output signal produced by the voltage controlled oscillator has a phase and frequency which is directly related to the phase and frequency of the reference signal.

These prior art phase-locked loop frequency synthesizers have the inherent disadvantage of requiring a physical alteration of the system structure in order to accommodate the wide range of frequency requirements of different frequency synthesizer systems. In order to change the frequency of the signal produced by the voltage controlled oscillator, the frequency of the reference signal or the frequency of the voltage controlled oscillator's output signal must be changed before they are provided to the phase detector. Presently, the frequency of the reference signal may be changed by changing the reference oscillator or by adding a device for dividing the reference signal frequency by a selected fixed value constant before providing it to the phase detector. Similarly, the frequency of the signal produced by the voltage controlled oscillator can be changed by adding a device for dividing it by a selected programmable range before providing it to the phase detector. All of these methods for changing the frequency of the VCO output signal, however, are undesirable because, they require the use of additional circuitry, a change in the physical make-up of the system, and additional design time (and cause increased physical size and increased power consumption) which tends to severely reduce the flexibility of the system and to significantly increase the cost thereof.

It is therefore an object of the present invention to provide a universal frequency synthesizer which provides the major components of a phase-locked loop frequency synthesizer system wherein said universal frequency synthesizer is capable of being programmed to vary the frequency of the output signal produced by the synthesizer's attendant voltage control oscillator without the need for physically altering or adding any elements to the phase-locked loop frequency synthesizer.

A further object of the present invention is to provide a universal frequency synthesizer capable of being incorporated into a phase-locked loop frequency synthesizer wherein said universal frequency synthesizer is constructed of a single design and can be programmed to vary the frequency of the output signal produced by the synthesizer's attendant voltage controlled oscillator.

Another object of the present invention is to provide a universal frequency synthesizer which is capable of providing a frequency prescaler function to the V. C. O.

Another object of the present invention is to provide a universal frequency synthesizer capable of being incorporated into a phase-locked loop frequency synthesizer wherein said universal frequency synthesizer is capable of being programmed to derive a plurality of different reference frequencies from a single reference oscillator.

An additional object of the present invention is to provide a universal frequency synthesizer capable of being incorporated into a phase-locked frequency synthesizer so that the system can be programmed for use in a number of operating environments without the need for changing or adding any physical components to it.

An additional object of the present invention is to provide a universal frequency synthesizer capable of being incorporated into a phase-locked loop frequency synthesizer wherein said universal frequency synthesizer is capable of being manufactured by LSI Techniques making it economical to produce on a mass scale.

Other and further objects of this invention, together with the features of novelty appurtenant thereto, will appear in the course of the following description.

DETAILED DESCRIPTION OF THE INVENTION

In the accompanying drawing, which forms a part of the specification and are to be read in conjunction therewith and in which like reference numerals are employed to indicate like parts in the various views:

FIGS. 2a, b, c and d are to be arranged to provide a detailed schematic diagram of the universal frequency synthesizer of the present invention.

The universal frequency synthesizer of the present invention is arranged to serve as one of the major building blocks of a phase-locked loop frequency synthesizer. In particular, this device comprises a voltage controlled oscillator prescaler and programmable divider, a programmable reference divider, a means for programming the reference dividers, and a phase detector which are integral components of every phase-locked loop system. The other elements typically found in a a phase-locked loop frequency synthesizer include a voltage controlled oscillator which is capable of producing an output signal having a frequency determined by the voltage of an input signal provided to its control input, a reference oscillator which is operable to produce a reference signal of a predetermined frequency, and a low pass filter which is capable of filtering the phase detector output voltage signal provided to the control input of the voltage controlled oscillator. These elements are of a conventional design which is well known to those of ordinary skill in the art. In addition, the interconnection of these elements with each other and with the universal frequency synthesizer of the present invention will be readily apparent to those having ordinary skill in the art.

Figure 1:
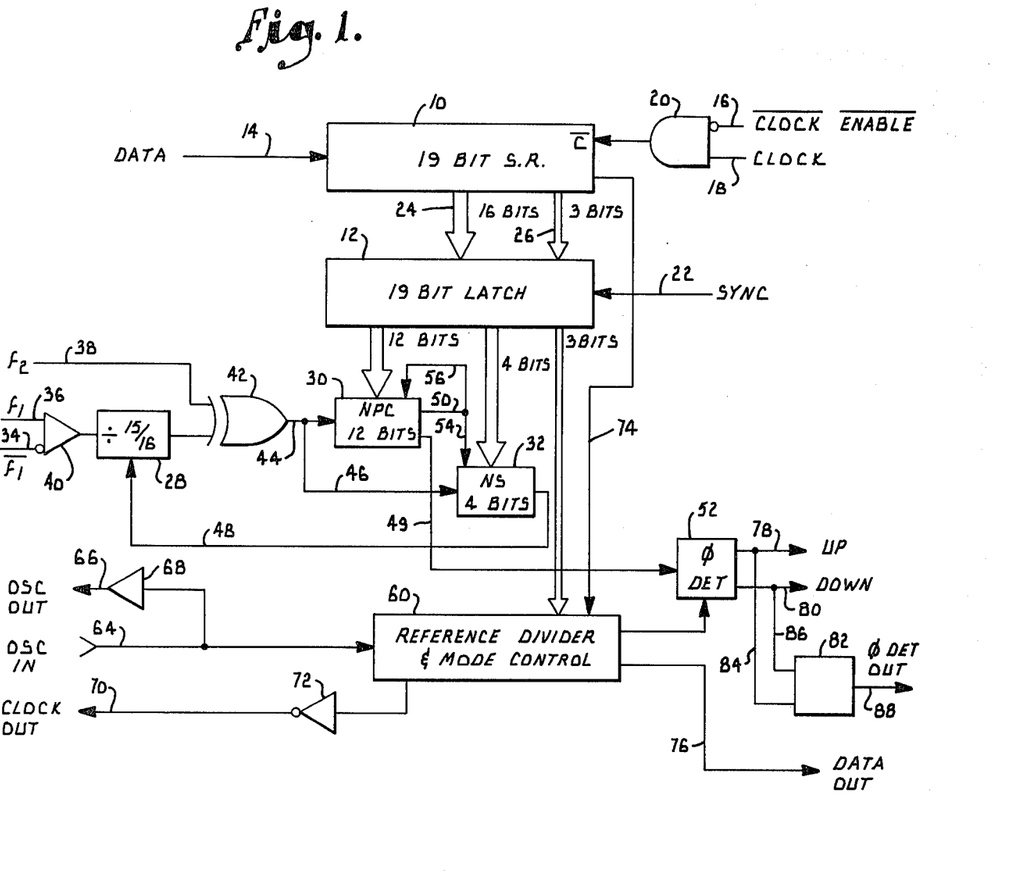
FIG. 1 is a block diagram of a universal frequency synthesizer of the present invention.

Reference is now made to the figures wherein a block diagram of the universal frequency synthesizer of the present invention is shown in FIG. 1. As shown in this figure, the universal frequency synthesizer includes a 19 bit shift register 10 and a 19 bit latch 12 for receiving and storing the tuning data used to control the condition of the device. This data is serially shifted into the 19 bit shift register 10 from an external source via the data input which is generally designated by the numeral 14. The introduction of tuning data is controlled by the clock enable input 16 and the clock input 18. These two inputs are electrically coupled with the clock input of the 19 bit shift register 10 through a logic gate 20. Application of a low level logic signal to the clock enable input causes logic gate 20 to be placed in condition to pass the clock pulses received at clock input 18 to the clock input of the 19 bit shift register 10. This logic gate, on the other hand, is disabled in response to the application of a high level logic signal to the clock enable input thereby inhibiting the transfer of clock pulses to the 19 bit shift register. The 19 bit shift register responds to the reception of a clock pulse by causing the data present on the data input 14 to be shifted into this shift register during the falling edge of the clock pulse. In this way, the admittance of data into the universal frequency synthesizer is controlled by logic state of the signal provided to the clock enable input 16. Since the clock signals provided to the clock input 18 are passed to the 19 bit shift register only if the clock enable input is of the proper logic value, the clock signal used to shift data into the 19 bit shift register can also be used for other purposes which are external to this device.

The transfer of data between the 19 bit shift register 10 and the 19 bit latch 12 is controlled by means of the sync input 22. Upon receiving a sync pulse on input 22, the data stored in a 19 bit shift register is transferred by means of a pair of data busses 24 and 26 to the 19 bit latch for temporary storage therein. Thereafter, data is retained within the 19 bit latch until new data is provided to the latch element in response to the receipt of a sync pulse via input 22.

The universal frequency synthesizer is also equipped with a dual modulo prescaler 28 and a pair of programmable counter circuits which are designated as the program counter 30 and the swallow counter 32. These circuit elements interact with each other to process the output signal produced by the synthesizer's attendant voltage controlled oscillator in accordance with a portion of the tuning data stored in the 19 bit latch 12. The universal frequency synthesizer is also equipped with a plurality of inputs 34, 36 and 38 which are arranged to be electrically coupled with the universal frequency synthesizer attendant voltage controlled oscillator (not shown).

The dual modulo prescaler 28 is a divider circuit having its input electrically coupled with input 34 and 36 through a logic gate 40. The output of this circuit, on the other hand, is electrically coupled with one input of an exclusive OR gate 42. The other input of exclusive OR gate 42 is electrically coupled with the F2 input 38. The output of the exclusive OR gate is electrically coupled with the program counter 30 and with the swallow counter 32 as represented by conductor lines 44 and 46 respectively.

The dual modulo prescaler 28 is operable to divide the frequency signal provided to it through logic gate 40 by either 15 or 16 depending upon the logic state of the signal provided to this circuit by means of the modulo control line 48. In particular, the presence of a high level logic signal on the modulo control line causes the dual modulo prescaler 28 to divide the incoming frequency signal by 16. In this way, the logic state of the signal present on the modulo control line 48 controls the division ratio of the dual modulo prescaler.

The program counter 30, on the other hand, is a counting circuit which is operable to divide the signal provided to it through the exclusive OR gate 42 by a programmed number "$N_1$". The number "$N_1$" represents the beginning count state of the down counting program counter and is determined in accordance with twelve of the bits stored within the latch element 12. The program counter is operable to count pulses from the exclusive OR gate 42 and causes a single output pulse to be generated on conductor line 49 and a reset signal to be produced on conductor line 50 each time "$N_1$" of these pulses are received. The single output pulse is sent to the signal input of the phase detector 52 by means of conductor line 49. The reset signal, on the other hand, is provided to the swallow counter 32 as represented by conductor lines 50 and 54 and to the program counter as represented by conductor lines 50 and 56. Upon receipt of a reset signal, the program counter is preset to a count state of "$N_1$" determined in accordance with the twelve data bits associated with this circuit. Thereafter, the program counter is in condition to begin counting pulses a second time.

The swallow counter is operable to count a programmed number of clock pulses provided to it through exclusive OR gate 42 and cooperates with the program counter to control the modulus of the dual modulo prescaler. These pulses are provided to the swallow counter from the exclusive OR gate 42 by means of conductor lines 44 and 46. The programmed number of pulses represent the beginning count state of this down counting circuit and are designated by the number "$N_2$". Four of the data bits stored within the 19 bit latch element 12 are associated with the swallow counter and are used to establish the beginning count state thereof.

While the swallow counter is counting its output is activated thereby providing a high level logic signal at this point. Once the counter reaches its maximum count state, its output is made inactive until a reset signal is received from the program counter. Upon receipt of a reset signal, the swallow counter is reset to a count state of "$N_2$" in accordance with the four data bits associated with this circuit.

The output of the swallow counter is electrically coupled with the dual modulo prescaler by means of the modulo control line 48 and is used to control the modulus of the dual modulo prescaler. The swallow counter generates at its output a low level logic signal whenever this circuit is counting. This low level logic signal is transferred to the dual modulo control line. The presence of a low level logic signal on the modulo control line causes the dual modulo prescaler to divide the incoming frequency signal by 15. Once the swallow counter reaches its zero count state, its output assumes a high level logic state which in turn causes the dual modulo prescaler to divide the incoming signal by 16. The dual modulo prescaler continues to divide the incoming signal by 16 until the swallow counter is reset and its counting operation restarted. In this way, the modulus of the prescaler is controlled by the count state of the swallow counter.

The universal frequency synthesizer may be used with or without the dual modulo prescaler. By electrically coupling input 38 with the output of the synthesizer's attendant voltage controlled oscillator and connecting inputs 34 or 36 to ground, the dual modulo prescaler is bypassed and the incoming frequency signal is provided directly to the program counter 30 through exclusive OR gate 42. In this mode of operation, the output signal from the voltage controlled oscillator is only operated upon by the program counter before being provided to the signal input of the phase detector 52. In other words, the incoming frequency signal is divided by a number "$N_1$" equal to the preset count state of the program counter before being applied to the signal input of the phase detector 52. The maximum count state of the program counter is determined by twelve of the data bits stored within the latch element 12 so that the number by which the received frequency is divided is capable of being changed without altering the physical components of the system.

To use the dual modulo prescaler, input 36 is electrically coupled with the output of the synthesizer's attendant voltage controlled oscillator while input 34 is bypassed to ground and input 38 is grounded. In this mode of operation, the total divide ratio of the dual modulo prescaler, the program counter, and the swallow counter is defined by the equation, $$N_T = 15N_2 + 16(N_1 - N_2) \text{ or}$$

$$N_T = 16N_1 - N_2$$

wherein $N_T$ represents the overall divide ratio, $N_1$ represents the preset count state of the program counter, $N_2$ represents preset count state of the swallow counter, such that the desired divide ratio $N_T$ is achieved, and $N_1$ is greater than $N_2$. In other words, the dual modulo prescaler initially divides the incoming frequency signal by 15 and passes a single pulse for every 15 pulses it receives. This single pulse from the dual modulo prescaler is transferred to the program counter and to the swallow counter by means of the exclusive OR gate 42. Upon receiving this pulse, the count state of the program and swallow counters is decremented one count state. The counting operation continues in this manner until the swallow counter reaches its zero count state. Thereafter, this counter's output is inhibited and the modulus of the dual modulo prescaler is changed to 16. In this mode of operation, the dual modulo prescaler divides the incoming frequency signal by 16 and outputs a single pulse each time 16 pulses are received by it. This single pulse from the dual modulo prescaler is then transferred to the program counter and to the swallow counter where it causes the program counter to be decremented one count state. The counting operation continues in this manner until state two (2) of the program counter is obtained. The next clock cycle following state two (2) causes the terminal state circuitry consisting of gate 198 and shift register 180 to change state. Once the program counter reaches this count state, the terminal state circuitry transmits a single pulse to the signal input of the phase detector by means of conductor line 49 and generates a preset signal on conductor line 50. This preset signal is simultaneously provided to the program counter and to the swallow counter where it causes both of these counters to be preset to a count state determined by the appropriate data bits stored in latch elements 1 thru 16. The preset signal is delayed for one clock cycle by gate 238 and shift register 182 and is used to activate the swallow counter output. Upon the next clock cycle, the output of the swallow counter is again activated and the modulus of the dual modulo prescaler is returned to 15, and the terminal state circuitry returns to its other state. The timing of the signals in this clock cycle are such that both program counter and swallow do not decrement. Thereafter, the above described counting operation is repeated.

The comparison input of phase detector 52 is electrically coupled with the reference divider and the mode control circuit 60. The reference divider and mode control circuit is a divider circuit which is operable to divide the incoming reference signal by a selected division ratio. The resulting comparison signal is then provided to phase detector 52 for comparison with the output signal of program counter 30.

The division ratio used in deriving the comparison signal is selected in accordance with three of the data bits stored in the 19 bit latch 12. In the preferred embodiment of the invention, the reference divider and mode control circuit is capable of dividing the incoming reference signal by 1 of 8 different division ratios. Each of these division ratios is assigned a different octal code. The three data bits assigned to the reference divider and mode control circuit are used in determining which division ratio is to be used in deriving the comparison signal. In this way, the reference divider and mode control circuit is capable of deriving from a single reference signal a comparison signal having one of eight different frequencies each of which is individually selected in accordance with three of the data bits stored within the 19 bit latch.

The reference signal is provided to the reference divider and mode control circuit by means of an input 64. An OSC out output 66 is provided to produce a buffered version of the incoming reference signal. This output is electrically coupled with the input line 64 through an output buffer 68. The reference divider and mode control circuit is also capable of outputting at the clock out output 70 a clock signal which is related to the incoming reference signal by a preselected division ratio. This output is electrically coupled with the reference divider and mode control circuit through an output buffer 72.

The reference divider and mode control circuit is also coupled with the 19 bit shift register by means of a conductor bus 74 having 3 conductors thereon. Upon receipt of a particular data code, the reference divider and mode control circuit causes the accompanying data provided to the 19 bit shift register to be outputted at the data out output 76.

Phase detector 52 is a type two phase and frequency detector having an up output 78 and a down output 80.

The phase detector is operable to activate the down output if the number of pulses from the program counter is greater than a number of pulses from the reference divider and mode control circuit. Activation of the up output causes a corresponding reduction in the frequency of the signal produced by the synthesizer's attendant voltage controlled oscillator. The up output is activated, however, if the number of signals provided to the phase detector from the reference divider and mode control circuit is greater than the number of signals provided to the detector from the program counter. Activation of the up output produces a corresponding increase in the frequency of the signal produced by the synthesizer's attendant voltage controlled oscillator. In this way, the signals provided to the phase detector are locked in phase and frequency and the frequency of the signal produced by the synthesizer's attendant voltage controlled oscillator is related to the frequency of the reference oscillator by a value determined in accordance with the tuning data.

An optional phase detector element 82 is provided in the preferred embodiment of the invention. This phase detector element is electrically coupled with the phase detector outputs 78 and 80 by means of conductor lines 84 and 86 respectively and is operable to produce a single control line output at 88 in response to the difference between the signals provided to this device via these conductor lines. This output will be pulled high when the up output is high and it will be pulled low when the down output is high. When both up and down outputs are low this output 88 will be in a high impedance condition where it is neither pulled high nor low.

Figure 2B:
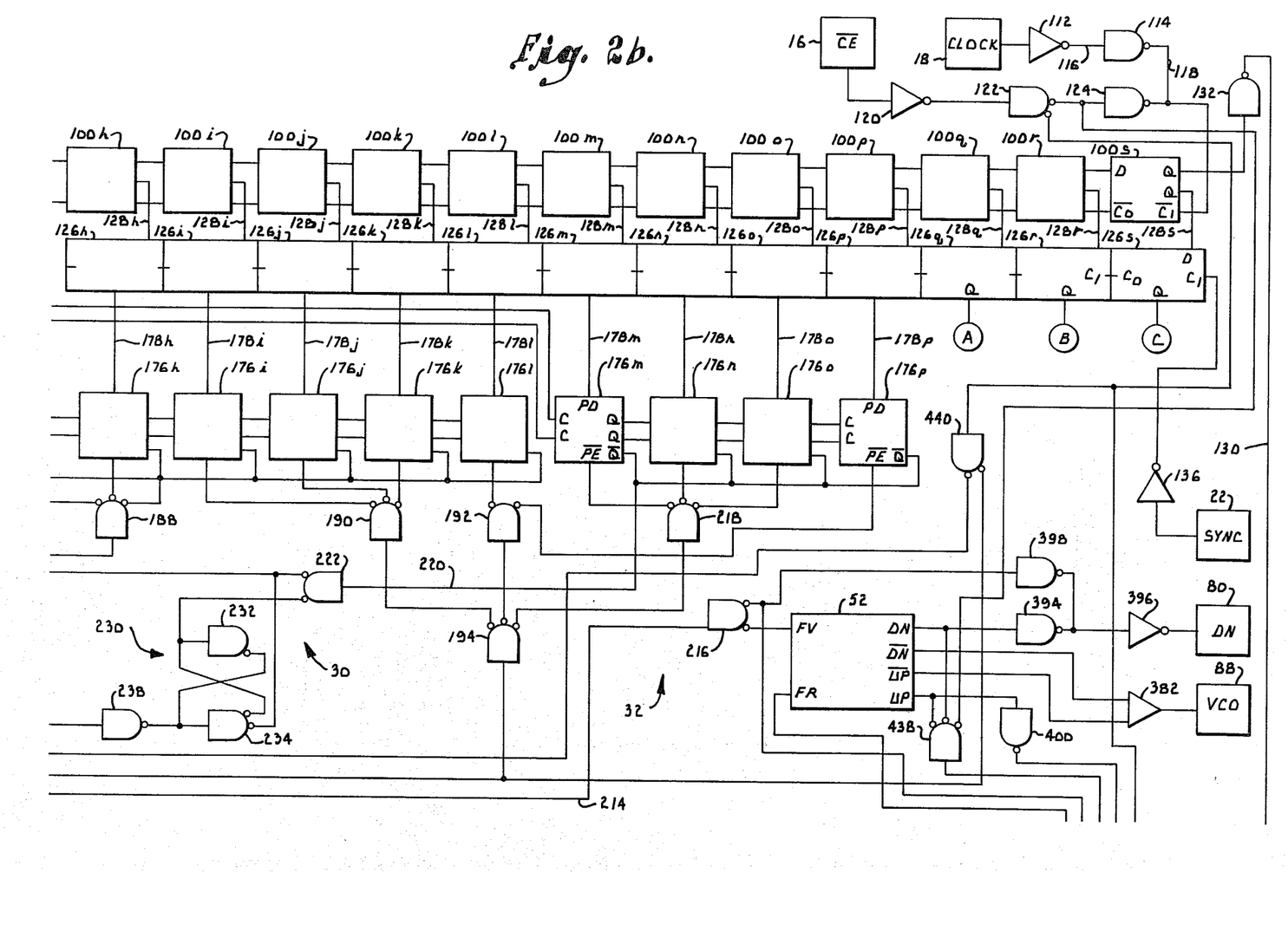
Figure 2C:
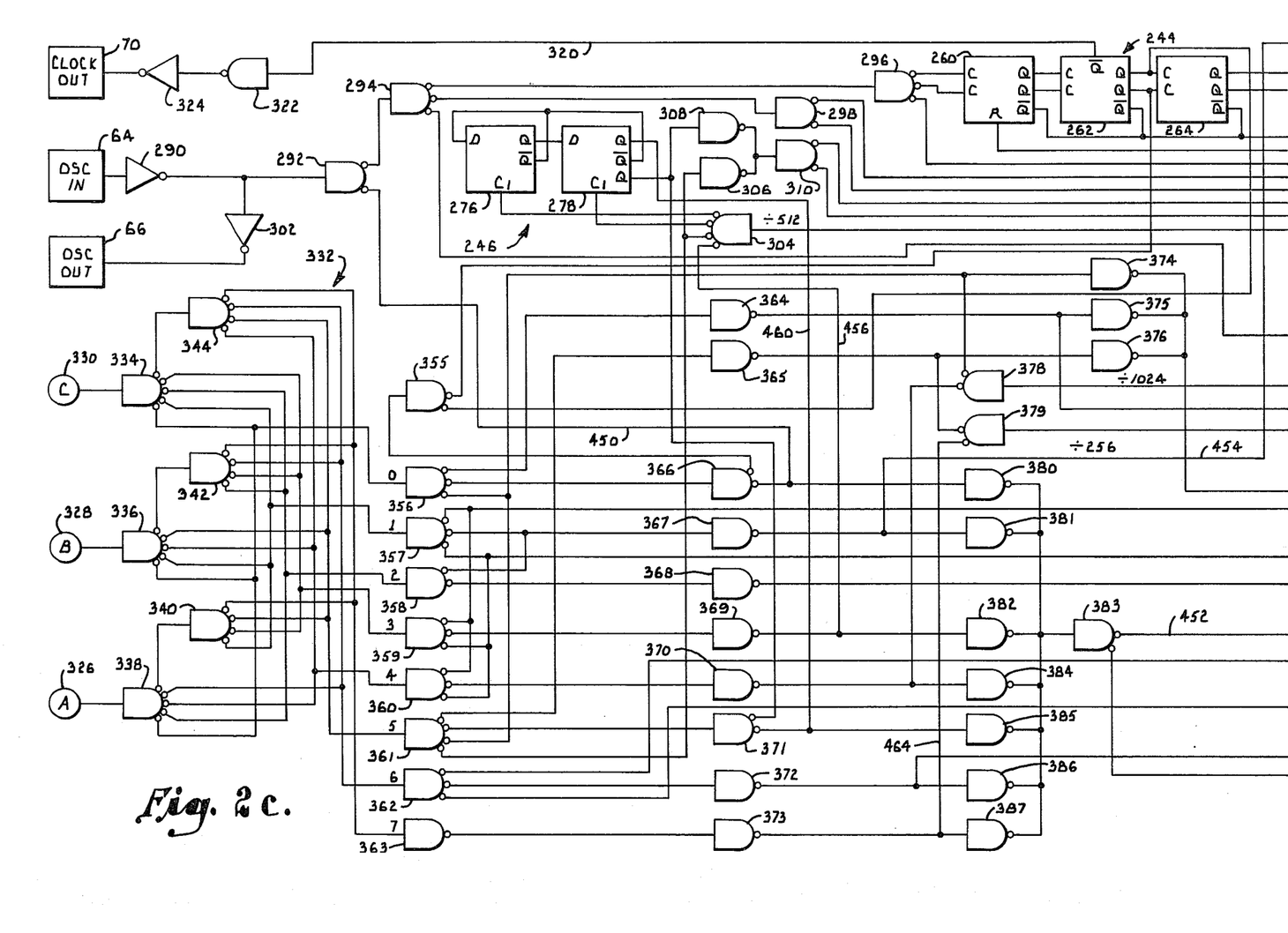
Figure 2D:
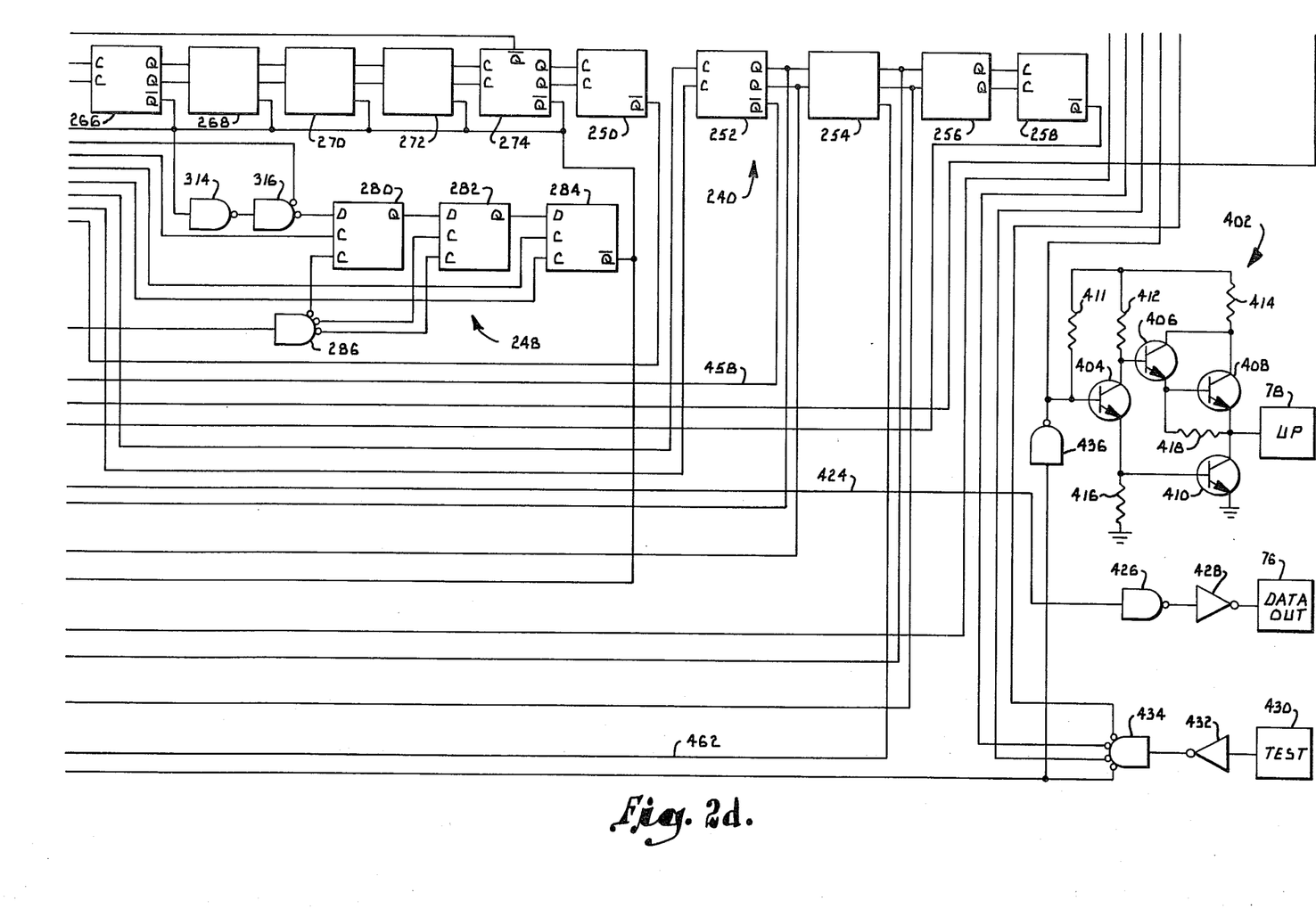
Figure 2E:
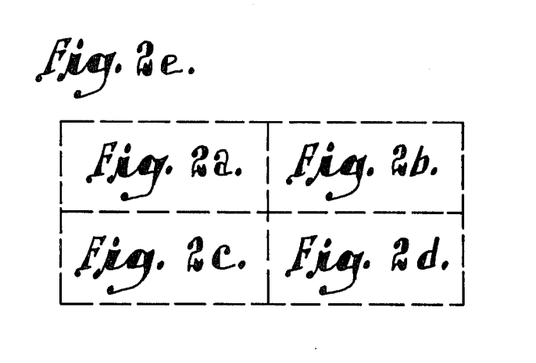
FIGS. 2e is a plot showing how FIGS. 2a, b, c and d are to be arranged for proper viewing.

Reference is now made to FIGS. 2a, b, c and d which show the universal frequency synthesizer of the present invention in greater detail. As shown in these figures, the 19 bit shift register 10 is comprised of a plurality of type D flip flops which are generally designated by the numerals 100a–s. Data is provided to the shift register by means of the data input 14. The data input is electrically coupled with the D input of the shift register 100a by an buffer 104 and a logic gate 106.

Data is clocked into the D flip flops which are interconnected to form the 19 bit shift register by means of an external clock signal which is provided to the universal frequency synthesizer at clock input 18. Application of the received clock signal to the 19 bit shift register is controlled by means of an external $\overline{\text{clock enable}}$ signal which is provided to the universal frequency synthesizer at input terminal 16. The clock input 18 is electrically coupled with the clock input of D flip flop 100s by means of an input buffer 112, a logic gate 114, and a pair of conductor lines 116 and 118. The $\overline{\text{clock enable}}$ input 16, on the other hand, is electrically coupled with the clock input of D flip flop 100s by means of a buffer element 120, a pair of logic gates 122 and 124 and conductor line 118.

Each D flip flop 100a–s of the 19 bit shift register is provided with an attendant latch element 126a–s. One of the Q outputs of each flip flop is electrically coupled with the D input of its associated latch element by means of a conductor line 128. In other words, D flip flop 100a is electrically coupled with latch element 126a by means of conductor line 128a. Similarly, D flip flop 100b is electrically coupled with latch element 126b by means of conductor line 128b and so on. In addition, the second Q output of flip flop 100s is electrically coupled with the circuitry of the reference divider and mode control circuit 60 by means of an electrical conductor line 130 and a logic gate 132.

The transfer of data from the D flip flops 100a–s to their corresponding latch elements is controlled by means of the sync input 22. The sync input is electrically coupled with the $\overline{C}_l$ input of latch element 126s by means of an input buffer 136 and an electrical conductor line 138.

Latch elements 126a–l are associated with the operation of the program counter 30 and are used to store the data bits employed in presetting the maximum count state of that counter. Latch elements 126m–p, on the other hand, are associated with the operation of the swallow counter 32 and are used to store the data bits employed in presetting the count state of that counter. Finally, latch elements 126q–s are associated with the control of the reference divider and mode control circuitry 60 and are used to store the three data bits employed in controlling the divide ratio of that circuit.

The universal frequency synthesizer is provided with a plurality of input terminals 34, 36, and 38 for receiving the frequency signal produced by its attendant voltage controlled oscillator. Input terminals 34 and 36 are electrically coupled with the dual modulo prescaler 28 by means of an input buffer 144 and a conductor line 146. Input terminal 38, on the other hand, is coupled directly with exclusive OR gate 42 by means of an input buffer 148 and an electrical conductor line 150.

The dual modulo prescaler is comprised of a plurality of counting circuits 152, 154, 156, 158, 160 and 162 which are interconnected by means of a pair of logic gates 164 and 166. The modulus of the dual modulo prescaler is controlled by the logic state of the signal on the modulo control line 48 which is electrically coupled to the PR input of counting circuit 152. The output of the dual modulo prescaler is electrically coupled with exclusive OR gate 42 by means of an electrical conductor line 168.

The output of exclusive OR gate 42 is electrically coupled with the program counter 30 and with the swallow counter 32 by means of logic gates 170, 172 and 174. The program counter is comprised of a plurality of resettable toggle flip flops 176a–l which are interconnected to form a counting circuit. The PD input of each of these flip flops is electrically coupled with the Q output of its associated latch element by means of conductor line 178a–l. In other words, the Q output of latch element 126a is electrically coupled with the PD input of flip flop 176a by means of conductor line 178a. Similarly, the Q-output of latch element 176b by means of a conductor line 178b and so on. The program counter also includes associated counter control logic circuitry including a pair of flip flops 180 and 182 and assorted logic gates 184, 186, 188, 190, 192, 194, 196 and 198. The output of the program counter is electrically coupled with the signal input of the phase detector 52 by means of a conductor line 214 and a logic gate 216.

The swallow counter 32, on the other hand, is also comprised of a plurality of presettable toggle flip flops which are designated by the numerals 176m–p. The PD input of each of these flip flops is similarly coupled with the Q-output of its associated latch elements by means of an electrical conductor line 178m–p. In other words, the Q output of latch element 126m is electrically coupled with the PD input of flip flop 176m by means of a conductor line 178m and so on. A logic gate 218 is provided to cause the toggle flip flops of the swallow counter to be preset upon receipt of an appropriate logic signal from the program counter. The output of the swallow counter is electrically coupled with the modulo control line 48 by means of a conductor line 220, and a plurality of logic gates 222, 224, 226 and 228. The output of logic gate 222 is also coupled with a latch 230 which is comprised of logic gates 232 and 234. The input of logic gate 234 is electrically coupled with the Q-output of flip flop 182 by means of a conductor line 236 and a logic state 238.

The other signal which is provided to the comparison input of phase detector 52 is derived from the reference signal within the reference divider and mode control circuit 60. The reference divider and mode control circuit includes a divider chain which is generally designated by the numeral 240 and select logic which is generally designated by the numeral 242. The divider chain is basically comprised of a primary counter 244, a first divide-by-three counter 246, a second divide-by-three counter 248 and a plurality of D flip flops 252, 254, 256 and 258 which are interconnected with the primary counter so as to extend the count state thereof. The primary counter 244 is comprised of a plurality of D flop flops 260, 262, 264, 266, 268, 270, 272, and 274 which are interconnected with each other to form a counting circuit having a maximum count state of 256. The first divide-by-three counter 246, on the other hand, is comprised of a pair of type D flip flops 276 and 278 which are interconnected to provide a counting circuit having a maximum count state of three. The second divide-by-three circuit 248 is comprised of a plurality of D flip flops 280, 282 and 284 and a logic gate 286.

The universal frequency synthesizer is provided with an "OSC in" input terminal 64 for accepting the reference signal produced by its attendant reference oscillator. The reference signal is distributed to the operable components of the reference divider and mode control circuit by means of an input buffer 290 and a plurality of logic gates 292, 294, 296 and 298. An OSC out output 66 is provided to output a buffered version of the reference signal. This output terminal is electrically coupled to receive the incoming reference signal through an output buffer 302. The universal frequency synthesizer is also equipped with a plurality of logic gates 304, 306, 308, 310, 314 and 316 for interconnecting the various counter circuits of the divider chain. One of the $\overline{Q}$ outputs of flip flop 262 is electrically coupled with the clockout output terminal 70 by means of a conductor line 320, a logic gate 322 and an output buffer 324.

The select logic 242 exercises gross control over the operation of this circuit and includes three inputs 326, 328 and 330 which are respectively coupled with the Q outputs of latch elements 126q, 126r and 126s. The select logic also includes a decoder matrix 332 which is comprised of a plurality of logic gates 334, 336, 338, 340, 342 and 344. Additional logic gates 355, 356, 357, 358, 359, 360, 361, 362, 363, 366, 367, 368, 369, 370, 371, 372, 373, 378, 379, 380, 381, 382, 383, 384, 385, 386, and 387 are provided to couple the decoder matrix with the operable components of the reference divider and mode control circuit.

Phase detector 52 is a type two phase and frequency detector. The universal frequency synthesizer is equipped with a "down" output 80, a VCO output terminal 88 and a "up" output 78. The DN output of phase detector 52 is electrically coupled with the "down" output 80 by means of a logic gate 394 and a output buffer 396. This output terminal is also coupled with the output of logic gate 216 by means of a logic gate 398. The "up" output 78, on the other hand, is electrically coupled with the "up" output of the phase detector by means of a logic gate 400 and an output buffer 402. Output buffer 402 is comprised of a plurality of transistors 404, 406, 408 and 410 and associated resistors 411, 412, 414, 416 and 418. The VCO output terminal 88 is electrically coupled with the $\overline{DN}$ output and the $\overline{UP}$ output of phase detector 52 by means of an output buffer 382. This output terminal is electrically coupled with the control input of the synthesizer's attendant voltage controlled oscillator to provide to this device a voltage signal representative of the phase and frequency difference between the signals provided to the signal and comparator inputs of phase detector 52.

The universal frequency synthesizer is also provided with a data output terminal 76 which is electrically coupled with the output of logic gates 374, 376, 375 by means of a conductor line 424, a logic gate 426 and a output buffer 428. A test input terminal 430 is also provided to provide a test signal to the universal frequency synthesizer. This test input is electrically coupled with the various components of the synthesizer by means of an input buffer 432 and a plurality of logic gates 434, 436, 438 and 440.

In operation, the desired frequency is initially selected. Thereafter, the various parameters needed to derive this frequency are manipulated to produce a VCO output signal having the desired frequency. Since the frequency of the reference signal produced by the reference oscillator always remains constant in normal operation, the only variables subject to change are the division ratios of the program counter, the swallow counter and the reference divider and mode control circuit. As a result, the division ratios of these circuits must be manipulated to produce a VCO output signal having the desired frequency.

If the dual modulo prescaler is to be used, the desired frequency is related to the reference frequency by the following equation:

$$\frac{F_D}{F_R} = \frac{(16 N_1 - N_2)}{D_R}$$

wherein $F_D$ is representative of the desired frequency, $F_R$ is representative of the reference frequency, $N_1$ is representative of the preset count state of the program counter, $N_2$ is representative of the preset count state of the swallow counter, and $D_R$ is representative of the division ratio of the reference divider and mode control circuit. If the universal frequency synthesizer of the present invention is to be used without the dual modulo prescaler, the relationship between the desired and reference frequency is defined by the equation:

$$F_D/F_R = N_1/D_R$$

wherein $F_D$ is representative of the reference frequency, $N_1$ is representative of the preset count state of the program counter, and $D_R$ is representative of the division ratio of the reference divider and mode control circuit. Accordingly, the required division ratios must be selected in accordance with the equation corresponding to the desired mode of operation (with or without the dual modulo prescaler).

Once the division ratios are selected, the data word representative of these ratios is assembled within an external source such as a digital computer, microprocessor, or hardware controlled device. In the preferred embodiment of the invention shown herein, each octal code capable of being produced by the three bits assigned to the reference divider and mode control circuit causes this circuit to assume one of the division ratios shown in Table 1. Bit "a" corresponds to the data bits stored within latch element 126q while bit "b" corresponds to the data bit stored within latch element 126r and so on.

The preset count state of the program counter, on the other hand, is controlled by the 12 data bits assigned to this counter. Each bit of the data word corresponding to the program counter is assigned a binary weight as shown in Table 2 with the preset count state of the program counter being determined by the sum of the weights of the active bits. For example, the preset count state of the program counter will be 3081 if bits 1, 4, 8, 11 and 12 are active (1+8+1024+2048=3081). Bit number 1 in this table corresponds to the data bit stored in latch element 128a while bit number 2 corresponds to the data bit stored in latch element 126b and so on.

The preset count state of the swallow counter is likewise controlled through manipulation of the four bits assigned to this counter. Each of the four data bits pertaining to the swallow counter is assigned the binary weights shown in Table 2. By summing the binary weights of the active bits, the preset count state of the swallow counter is obtained. For example, activation of bits 1, 2 and 3 causes the swallow counter to assume a maximum count state of 7 (1+2+4=7). Bit number 1 in the table corresponds to the data bit stored in latch element 126m while bit number 2 corresponds to the data bit stored in latch element 126n and so on.

The data word is assembled so that the first three bits of the word are representative of the division ratio to be employed by the reference divider and mode control circuit while the next four bits of the data word are associated with the operation of the swallow counter. The final twelve bits of the assembled data word are representative of the preset count state of the program counter. As a result, the data word is assembled so that the C bit of the three bit data code assigned to control the division ratio of the reference divider and mode control circuit is the first bit clocked into the synthesizer followed by the other two bits of the octal reference divider mode control code. The next four bits of the data word pertain to the swallow counter with the bit having a binary weight of eight being placed in the first position so that it will be stored in latch element 126p and the bit having the binary weight of 1 being in the last position so that it will be stored in latch element 126m. The next twelve bits of the word pertain to the operation of the program counter in decending order of binary weights from right to left. As a result, the last bit clocked into the synthesizer is the program counter data bit assigned the weight of 1.

Once the data word has been properly assembled, the individual bits of the data word are serially clocked into the 19 bit shift register 10 through the data input 14. The inputting of data is controlled by means of the logic value of the signal provided to the clock enable input 16. In particular, application of an enable signal having a low level logic value to the clock enable input 16 puts logic gates 122 and 124 in condition to pass clock pulses received at the clock input terminal 18 to the 19 bit shift register. As long as a low level logic signal is provided to input terminal 16, the clock pulses provided to input terminal 18 are passed to the clock input of the 19 bit shift register.

The presence of a stable data bit at input terminal 14 during the falling edge of a clock signal causes the data bit to be shifted into the first D flip flop 100a of the 19 bit shift register. Thereafter, each clock pulse causes the data previously inputted in the 19 bit shift register to be progressively moved through the storage elements of the shift register and any new data appearing at the data input terminal to be transferred to the first storage element of the register. In other words, the data stored in shift register 100a during a first clock pulse is transferred to flip flop 100b upon receipt of a second clock pulse and the data present at the data input 14 during this second clock pulse is transferred to flip flop 100a. Upon receipt of a third clock pulse, the data stored in flip flop 100b is transferred to flip flop 100c, the data stored in flip flop 100a is transferred to flip flop 100b and any new data present at input terminal 14 is transferred to flip flop 100a. This input sequence continues until all 19 bits of the data word have been serially inputted into this shift register. Thereafter, the clock enable signal provided to input terminal 16 is returned to a high level logic signal thereby disabling the transfer of clock pulses to the 19 bit shift register. In this way, the further application of clock pulses to input terminal 18 does not cause a change in the data temporarily stored within the 19 bit shift register. Accordingly, the clock signals can be used to drive additional circuitry without affecting the data stored within the universal frequency synthesizer.

The Q outputs of latch elements 126q-s are electrically coupled with the reference divider and mode control circuit so that the data stored within these latch elements are used to control the divide ratio of this circuit as illustrated in Table 1. The Q outputs of latch elements 126m-p, on the other hand, are electrically coupled with the components 176m-p of the swallow counter as illustrated in Table 3. Finally, the Q output of each latch element 126a-l is electrically coupled with its associated component 176a-l of the program counter 30 by means of electrical conductor lines 178a-l respectively. As a result, the data bits stored within these latch elements are used to control the preset count state of the program counter as represented in Table 2.

If the dual modulo prescaler 28 is to be used in processing the output signal from the synthesizer's attendant voltage controlled oscillator, the output of this oscillator is electrically coupled with input terminal 36. Input terminal 34 is bypassed to ground and terminal 38, on the other hand, is grounded. If, on the other hand, it is desirable to bypass the dual modulo prescaler, the output of the synthesizer's attendant voltage controlled oscillator is electrically coupled with input 38. Input terminals 34 or 36, however, are grounded in this mode of operation.

If the dual modulo prescaler is to be used, the frequency signal received at input terminal 36 is provided to the dual modulo prescaler 28 through an input buffer 144 and conductor 146. Upon activation of the universal frequency synthesizer, the count state of the program counter and the count state of the swallow counter are initially preset to a count state in accordance with the data stored within the associated components of the 19 bit latch. The dual modulo prescaler then divides the incoming signal by 15 and provides a single pulse to exclusive OR gate 42 by means of conductor line 168 upon receipt of 15 pulses. Exclusive OR gate 42 then passes this pulse to the program counter and the swallow counter where it is used to decrement these counters one count state.

The counting operation continues in this manner until the zero count state of the swallow counter is obtained. Upon reaching its zero count state, the swallow counter terminates the low level logic signal produced by this counter on conductor line 220. Termination of this low level logic signal causes latch 230 to be set and the modulus control line to assume a logic state representative of a prescaler count state of 16. Accordingly, the swallow counter controls the modulus of the dual modulo prescaler. In this mode of operation, the dual modulo prescaler divides the incoming frequency signal by 16 and outputs through exclusive OR gate 42 a single clock pulse after 16 pulses are received. This single clock pulse is then transferred to the program counter and to the swallow counter. Upon receipt of this pulse, the program counter is decremented one count state. The counting operation continues in this manner until the zero count state of the program counter is obtained. As the program counter reaches its zero count state, a logic signal is provided to the D input of flip flop 180 through logic gate 198. Upon receipt of this logic signal by flip flop 180, the logic state of the signal transmitted from the program counter to the signal input of phase detector 52 by means of conductor line 214 is changed. This flip flop also responds to this logic signal by outputting a preset signal at its Q outputs. The preset signal is distributed to the preset inputs of the flip flops which makes up the program and swallow counters by means of logic gates 184, 186, 188, 190, 192, 194, 196 and 218. Upon receipt of this preset signal, the flip flops which comprise the program and swallow counters causes these circuit elements to be preset in accordance with their associated data bits. The falling edge of this output pulse from the exclusive OR gate also causes flip flop 182 to be cleared which in turn resets latch 230.

The next pulse from the exclusive OR gate 42 causes flip flop 180 to be cleared which in turn removes the preset signal thereby allowing the counting operation to be restarted. As flip flop 180 is cleared, the logic state of the signal again changes thereby completing the pulse to the phase detector. Resetting of latch 230 causes the modulus control line to be returned to a logic state representative of a modulus of 15 thereby allowing the counting operation to be initiated anew.

If the dual modulo prescaler is not used, the incoming frequency signals are provided directly to exclusive OR gate 42 by means of input terminal 38, input buffer 148 and conductor line 150. In this mode of operation, each frequency pulse causes the count state of the program counter to be decremented 1 count state. The program counter continues to count in this manner until its zero count state is obtained. Upon receipt of this logic signal by flip flop 180, the logic state of program and swallow counters causes these circuit elements to be preset in accordance with their associated data bits.

The next pulse from the exclusive OR gate 42 causes flip flop 180 to be cleared which in turn removes the preset signal thereby allowing the counting operation to be restarted. As flip flop 180 is cleared, the logic state of the signal again changes thereby completing the pulse to the phase detector.

The reference signal which is provided to the reference input of the phase detector is derived from the reference signal within the reference divider and mode control circuit 60. The reference divider and mode control circuit accepts the reference signal at its OSC IN input terminal 64. The reference signal is distributed from this point by means of input buffer 290 and a plurality of logic gates 292, 294 and 296. A buffered version of the reference signal is also provided at the OSC OUT output terminal 66.

The incoming reference signal is initially provided to the divider chain 240 of the reference divider and mode control circuit where it is divided by a constant which is selected in accordance with the octal code stored within latch elements 126$q$–$s$. The division ratio to be established for each octal code is shown in Table 1. The reference divider and mode control circuit also provides at the Data Out output terminal 76 a selectable output which is controlled by the three bit octal code stored in latch elements 126$q$–$s$ as represented in Table 4.

The decode matrix 332 of reference divider and mode control circuit senses the octal code stored in latch elements 126$q$–$s$ land places its associated logic gates 355-387 (except 377) in condition to appropriately control the counting operation of the divider chain in response to this octal code to thereby establish the appropriate division ratio. The select logic also controls at the data out output terminal 76 outputting of the selected data.

The decoder matrix responds to an octal code of "0" by enabling logic gate 356. Enabling of this logic gate causes the incoming reference signal to be provided directly to the reference input of phase detector 52 by means of conductor line 450, logic gate 380, logic gate 383, and conductor line 452 and places logic gates 364, 365, 374, 375 and 376 in condition to pass the incoming serial data to the data out output terminal 76.

An octal code of "1" on the other hand, causes the decoding matric 332 to enable logic gate 357. Upon being enabled, this logic gate places the divider chain 240 in condition to divide the incoming reference signal by 256 before transferring it to the reference input of phase detector 52. Enabling of this logic gate also places logic gates 367 and 381 in condition to pass to the phase comparator the logic signal produced by flip flop 274 of the primary counter at its $\overline{Q}$ output. In this mode of operation, the incoming reference signal is used to clock the primary counter 244 which is comprised of toggle flip flop 260, 262, 264, 266, 268, 270, 272, and 274. The toggle flip flops of the primary counter are interconnected with each other so as to produce at the $\overline{Q}$ output of flip flop 274 a square wave having a frequency related to the frequency of the incoming reference signal by a factor of 256. The resulting square wave is passed to the comparison input of phase detector 52 by means of conductor line 454, logic gate 381, logic gate 383 and conductor line 452.

As shown in Table 1, the incoming reference signal is divided by 259 if an octal code of "2" is stored within latch elements 126$q$–$s$. The decoding matrix 332 responds to an octal code of "2" by causing logic gate 353 to be enabled which in turn causes the primary counter to operate in combination with divide-by-three counter 248 and places logic gates 367 and 381 in condition to pass the logic signal produced at the Q output of flip flop 274 to the comparison input of the phase comparator as described above. In this mode of operation, the primary counter 244 and the divide-by-three counter 248 cooperate to expand the maximum count state of the primary counter by three counts to thereby provide a division ratio of 259 rather than 256. Once the primary counter obtains its maximum count state, it is not immediately reset. Resetting of this counter is rather delayed for three clock pulses. In this mode of operation the divide-by-three counter 248 is activated once the primary counter reaches its maximum count state. Once this divide-by-three counter obtains its maximum count state, the primary counter is reset thereby allowing the counting operation of this counter to be restarted. In this way, the count state of the primary counter is expanded by three count states thereby providing a division ratio of 259.

The reference divider and mode control circuit responds to an octal code of "3" by dividing the incoming reference signal by 512. The presence of an octal code of "3" causes the decoder matrix to enable logic gate 359. Enabling of this logic gate causes the primary counter to operate in combination with the flip flop 250 to thereby double the maximum count state of the primary counter. In this mode of operation, flip flop 250 is arranged to be clocked by flip flop 274 of the primary counter. In this way, the resulting counting chain comprised of the primary counter and flip flop 250 is operable to produce at the Q output of flip flop 250 a square wave having a frequency related to the frequency of the incoming reference signal by a factor of 512. The resulting square wave is then transmitted to logic gate 304 for distribution to the comparison input of phase detector 52 by means of conductor line 456, logic gate 382, logic gate 383 and conductor line 452. The square wave provided to logic gate 304 is also passed by this logic gate to flip flop 252 where it is used to derive the frequency signal provided at the data out output terminal 76.

The reference divider and mode control circuit assumes a division ratio of 1024 in response to an octal code of "4". The decode matrix responds to an octal code of "4" by enabling logic gate 360 which in turn causes the primary counter to cooperate with flip flops 250 and 252 to provide a maximum count state of 1024. In this mode of operation, flip flop 250 operates in combination with the primary counter as described above and the Q output of this flip flop is used to clock flip flop 252 through logic gates 304, 306 and 310. The resultant effect of this counting operation is to produce at the $\overline{Q}$ output of flip flop 252 a square wave having a frequency related to the frequency of the received reference signal by a factor of 1024. This square wave is passed to the comparison input of phase detector 52 by means of conductor line 458, logic gate 378, logic gate 384, logic gate 383 and conductor line 452. The resulting square wave is also provided to the data output terminal 76 by means of conductor line 458, logic gate 378, logic gate 374, conductor line 424, logic gate 426 and output buffer 428.

In this mode of operation flip flop 250 operates in combination with the primary counter as described above and the output of this flip flop is used to clock flip flop 252. This output signal is provided from the Q output of flip flop 250 to the clock input of flip flop 252 by means of logic gates 304, 306 and 310.

An octal code of "5", on the other hand, places the reference divider and mode control circuit in condition to divide the incoming reference signal by 1536. In this mode of operation, the output signal from the $\overline{Q}$ output of flip flop 250 (which is representative of a division ratio of 512) is provided to divide-by-three counting circuit 246 through logic gate 304. This divide-by-three counter is capable of expanding the division ratio by a factor of three thereby providing at the Q output of flip flop 278 a square output signal having a frequency related to the frequency of the received reference signal by a factor of 1536. This output signal is then provided to the comparison input of phase detector 52 by means of conductor line 460, logic gate 385, logic gate 383 and conductor line 452.

As illustrated in Table 1, the reference divider and mode control circuit responds to an octal code of "6" by dividing the reference signal by 2048. An octal code of 6 enables logic gate 362 which in turn places the reference divider and mode control circuit in condition to divide the incoming reference signal by 2048. This division function is performed by adding flip flop 254 onto the divider chain comprised of the primary counter 244, flip flop 250 and flip flop 252. In particular, these flip flops are interconnected so that flip flop 254 produces at its $\overline{Q}$ output a square wave having a frequency related to the frequency of the received reference signal by a factor of 2048. This output signal is then provided to the comparison input of phase detector 52 by means of conductor line 462, logic gate 386, logic gate 383 and conductor line 452.

An octal code of "7", on the other hand, causes the decode matrix 332 to enable logic gate 363 which in turn results in the reference divider and mode control circuit dividing the incoming reference signal by 8192. In particular, the reference divider and mode control circuit responds to an octal code of "7" by effectively adding two additional flip flops 256 and 258 onto the divider chain comprised of the primary counter, flip flop 250, flip flop 252, and flip flop 254. In this mode of operation, the resulting divider chain produces at the $\overline{Q}$ output of flip flop 258 a square wave having a frequency related to the frequency of the received reference signal by a factor of 8192. This output signal is initially provided to logic gate 379 before being passed to the comparison input of phase detector 52 by means of conductor line 464, logic gate 387, logic gate 383 and conductor line 452.

It should be noted that, while the various counters may be continuously producing output signals during the counting operation, these signals are passed to the comparison input of phase detector 52 only if the logic gates responsible for such transfer are in condition to allow it. As a result, an octal code of "1" only allows passage to the phase detector of a signal related to the reference signal by a factor of 256. Similarly, the logic circuitry responds to an octal code of "2" by allowing passage of the signal which is related to the reference signal by a factor of 259 and so on.

Phase detector 52 is comprised of a type two phase and frequency detector which is operable to produce an output signal related to the difference in frequency between the signals provided to its signal and comparison inputs. If the frequency of the signal provided to a signal input from the program counter is less than the frequency of the signal provided to the comparison input from the reference divider and mode control circuit, the down output designated DN is at a low logic level while the up output designated UP is a positive going pulse whose width is equal to the difference between the trailing edge of the signal provided to the signal input and the trailing edge of the signal provided to the comparison input. If, on the other hand, the frequency of the signal provided to the signal input is greater than the frequency of the signal provided to the comparison input, the up line is at a low logic level while the down output line provides a positive going pulse whose width is equal to the difference between the successive trailing edges of the signal provided to the signal input and the signal provided to the comparison input. The logic signals provided at the down output of the phase detector are transferred at the down output 80 by means of logic gate 394 and output buffer 396. The logic signals produced at the up output, on the other hand, are provided to the up output 78 by means of logic gate 400 and output buffer 402. The phase detector is also operable to provide at its $\overline{DN}$ and the $\overline{UP}$ outputs voltage signals representative of the phase and frequency difference between the signals provided to the signal and comparison inputs of this device. The signals provided at these two outputs are converted into a DC voltage signal which is representative of the phase and frequency diference between these two signals. This DC voltage signal is then provided to the synthesizer's attendant voltage controlled oscillator by means of the VCO output terminal 88.

The synthesizer's attendant voltage controlled oscillator responds to this voltage signal by varying the frequency of the signal produced by it in accordance with this voltage signal. In particular, the voltage controlled oscillator varies the signal so as to reduce the phase and frequency difference between the signals provided to the signal input and the comparison input of the phase detector. In this way, the universal frequency synthesizer and its attendant voltage controlled oscillator cooperate to synchronize the phase and frequency of the signals provided to the signal and comparison inputs of the phase detector. As a result, the frequency of the signal produced by the voltage controlled oscillator can be adjusted through manipulation of the count state of the program counter, the count state of the swallow counter, the output frequency of the synthesizer's attendant reference oscillator and the division ratio employed by the reference divider and mode control circuit.

From the foregoing, it will be seen that this invention is one well adapted to attain all of the ends and objects herein set forth together with the other advantages which are obvious and which are inherent to the structure.

It will be understood that certain features and subcombinations are of utility and may be employed without reference to other features and subcombinations.

If any possible embodiments may be made of the invention without the party from the scope thereof, it has to be understood that all matter herein set forth or shown in the accompanying drawings is to be interpreted as illustrative and not in a limiting sense.

TABLE 1

Division Ratio For Reference Divider And Mode Control Circuit

| CODE | | | | |
|---|---|---|---|---|
| A | B | C | OCTAL | DIVISION RATIO |
| 0 | 0 | 0 | 0 | 1 |
| 0 | 0 | 1 | 4 | 1024 |
| 0 | 1 | 0 | 2 | 259 |
| 0 | 1 | 1 | 6 | 2048 |
| 1 | 0 | 0 | 1 | 256 |
| 1 | 0 | 1 | 5 | 1536 |
| 1 | 1 | 0 | 3 | 512 |
| 1 | 1 | 1 | 7 | 8192 |

TABLE 2

Binary Weights Assigned to the 12 Bits Corresponding To The Program Counter

| Bit Number | Weight |
|---|---|
| 1 | 1 |
| 2 | 2 |
| 3 | 4 |
| 4 | 8 |
| 5 | 16 |
| 6 | 32 |
| 7 | 64 |
| 8 | 128 |
| 9 | 256 |
| 10 | 512 |
| 11 | 1024 |
| 12 | 2048 |

TABLE 3

Binary Weights Assigned To 4 Bits Corresponding To The Swallow Counter

| Bit Number | Weight |
|---|---|
| 1 | 1 |
| 2 | 2 |
| 3 | 4 |
| 4 | 8 |

TABLE 4

Selected Data Provided At The Data Out Output Terminal

| Octal Code | | | Data Out |
|---|---|---|---|
| A | B | C | |
| 0 | 0 | 0 | Serial Data from 19 Bit Shift Register |
| 1 | 0 | 1 | Ref. Osc. ÷ 24576 |
| 1 | X | 0 | Ref. Osc. ÷ 1024 |
| X | 1 | X | Ref. Osc. ÷ 1024 |
| 0 | 0 | 1 | Ref. Osc. ÷ 1024 |

Having thus described our invention, we claim:

1. A universal frequency synthesizer for use in combination with a voltage controlled oscillator operable to generate an output signal having a frequency related to a voltage signal applied to the control input of said voltage controlled oscillator and a reference oscillator operable to generate a reference signal having a preselected reference frequency, said universal frequency synthesizer comprising:
input means for receiving tuning data from an external source;
VCO input means for receiving the output signal generated by said voltage controlled oscillator;
reference oscillator input means for receiving the reference signal produced by said reference oscillator;
phase detector means having a first comparator input and a second comparator input, said phase detector means being operable to compare the frequency of the signal provided to said first comparator input with the frequency of the signal provided to said second comparator input and to produce an output signal which is related to the difference in frequency between the signals provided to said first and second comparison inputs;
means for coupling said VCO input means with said first comparator input of said phase detector means; and
first divider means for coupling said reference oscillator input means with said second comparison input of said phase detector means, said first divider means being operable to divide the received reference signal by a constant determined by a portion of said tuning data before providing this signal to said second comparison input of said phase detector.

2. The universal frequency synthesizer of claim 1 wherein said input means is comprised of
  a shift register having a data input for receiving said tuning data and a clock input for receiving clock pulses, and
  switch means having an enable input for receiving an external enable signal, a clock input for receiving external clock pulses and a single output coupled with the clock input of said shift register, said switch means being operable to pass clock pulses to the clock input of said shift register if an enable signal is being applied to said enable input.

3. The universal frequency synthesizer as in claim 2 wherein said input means includes a latch element having a stored input, said latch element being electrically coupled with said shift register and operable to permanently store therein tuning data from said shift register in response to a store signal applied to said stored input.

4. The universal frequency synthesizer as in claim 1 wherein said means for coupling said VCO input means with said first comparison input of said phase detector means includes a second divider means for dividing said VCO input means determined by at least a portion of said tuning data before providing this signal to said first comparison input of said phase detector.

5. The universal frequency synthesizer as in claim 4 wherein said second divider means is comprised of a counter having a preset state determined by at least a portion of said tuning data, said counter being coupled with said VCO input means so that said counter is clocked by the received output signal from said voltage controlled oscillator, said counter being operable to be reset to a count state of zero and to be preset to a maximum count state determined by at least a portion of said tuning data upon obtaining its previously preset maximum count state.

6. The universal frequency synthesizer as in claim 4 wherein said second divider means is comprised of:
  a first counter having a preset state determined by at least a portion of said tuning data, said first counter being operable to produce a preset signal upon obtaining its zero count state and of responding to said preset signal by being preset to a count state determined by at least a portion of said tuning data,
  a second counter having a preset count state determined by at least a portion of said tuning data, said second counter being operable to inhibit its output upon obtaining its zero count state and operable to respond to said preset signal by being preset to a count determined by at least a portion of said tuning data,
  a third counter having a variable maximum count state which is controlled by the condition of said second counter, said third counter being coupled with said VCO input means so as to be clocked by the received output signal generated by said voltage controlled oscillator,
  means for coupling said third counter with said first and second counters, and
  means for coupling said first counter with said first comparison input of said phase detector means.

7. The universal frequency synthesizer as in claim 4 wherein said second divider is comprised of
  a first counter having a maximum count state $C_1$ which is determined by at least a portion of said tuning data,
  a second counter having a maximum count state $C_2$ which is determined by at least a portion of said tuning data,
  a third counter having a first maximum count state $C_3$ and a second maximum count state $C_4$, and wherein said first, second and third counters are coupled with each other so as to provide a total division ratio defined by the equation:

Division Ratio $= C_4 C_2 + C_3(C_1 - C_2)$.

8. The universal frequency synthesizer as in claim 1 wherein said first divider means is comprised of
  counting means for dividing the received reference signal by a plurality of different constants,
  decoding means for selecting in accordance with at least a portion of said tuning data the constant to be used by said counting means, and
  means for coupling said counting means with said second comparison input of said phase detector means.

9. A universal frequency synthesizer for use in combination with a voltage controlled oscillator operable to generate an output signal having a frequency related to a voltage signal applied to the control input of said voltage controlled reference signal having a preselected reference frequency, said universal frequency synthesizer comprising:
  input means for receiving tuning data from an external source;
  VCO input means for receiving the output signal generated by said voltage controlled oscillator;
  reference oscillator input means for receiving the reference signal produced by said reference oscillator;
  phase detector means having a first comparator input and a second comparator input, said phase detector means being operable to compare the frequency of the signal provided to its first comparator input with the frequency of the signal provided to its second comparator input and to produce an output signal which is related to the difference in frequency between the signals provided to its first and second comparator inputs; and
  means for coupling said reference oscillator input means with said second comparator input of said phase detector;
  first divider means for coupling said VCO input means with said first comparator input of said phase detector means, said first divider means being operable to divide the received output signal from said voltage controlled oscillator by a constant determined by at least a portion of said tuning data before providing this signal to said first comparator input of said phase detector.

10. The universal frequency synthesizer as in claim 9 wherein said first divider means is comprised of a counter having a maximum count state determined by at least a portion of said tuning data, said counter being coupled with said VCO input means so that said counter is clocked by the received output signal from said voltage controlled oscillator, said counter being operable to count to a count state of zero and to be preset to a maximum count state determined by at least a portion of said tuning data upon obtaining its previously preset maximum count state.

11. The universal frequency synthesizer as in claim 9 wherein said first divider means is comprised of
   a first counter having a maximum count state determined by at least a portion of said tuning data, said first counter being operable to produce a preset signal upon obtaining its zero count state and of responding to said reset signal by being preset to a count state determined by at least a portion of said tuning data,
   a second counter having a maximum count state determined by at least a portion of said tuning data, said second counter being operable to inhibit its output upon obtaining its zero count state and operable to respond to said preset signal by being preset to a count state determined by at least a portion of said tuning data,
   a third counter having a variable maximum count state which is controlled by the condition of said second counter, said third counter being coupled with said VCO input means so as to be clocked by the received output signal from said voltage controlled oscillator,
   means for coupling said third counter with said first and second counters, and
   means for coupling said first counter with said first comparator input of said phase detector means.

12. The universal frequency synthesizers as in claim 9 wherein said first divider means is comprised of
   a first counter having a maximum count state $C_1$ which is determined by at least a portion of said tuning data,
   a second counter having a maximum count state of $C_2$ which is determined by at least a portion of said tuning data,
   a third counter having a first maximum count state $C_3$ and a second count state of said third counter being controlled by the condition of said second counter, and
   wherein said first, second and third counters are coupled with each other so as to provide a total division ratio defined by the equation:

Division Ratio $= C_4 C_2 + C_3(C_1 - C_2)$.

13. The universal frequency synthesizer of claim 9 wherein said input means is comprised of
   a shift register having a data input for receiving said tuning data and a clock input for receiving clock pulses,
   switch means having an enable input for receiving an external enable signal, a clock input for receiving external clock pulses and a single output coupled with the clock input of said shift register, said switch means being operable to pass clock pulses to the clock input of said shift register if an enable signal is being applied to said enable input.

14. The universal frequency synthesizer as in claim 13 wherein said input means includes a latch element having a store input, said latch element being electrically coupled with said shift register and operable to permanently store therein tuning data from said shift register in response to a store signal applied to said store input.

15. The universal frequency synthesizer as in claim 9 wherein said means for coupling said reference oscillator input means with said second comparator input of said phase detector means includes second divider means for dividing the received reference signal by a constant determined by at least a portion of said tuning data before providing this signal to said second comparator input of said phase detector.

16. The universal frequency synthesizer as in claim 15 wherein said second divider means is comprised of
   counting means for dividing the received reference signal by a plurality of different constants,
   decoding means for selecting in accordance with at least a portion of said tuning data the constant to be used by said counting means, and
   means for coupling said counting means with said second comparison input of said phase detector.

17. A universal frequency synthesizer for use in combination with a voltage controlled oscillator operable to generate an output signal having a frequency related to a voltage signal applied to the controlled input of said voltage controlled oscillator and a reference oscillator operable to generate a reference signal having a preselected reference frequency, said universal frequency synthesizer comprising:
   input means for receiving tuning data from an external source;
   VCO input means for receiving the output signal generated by said voltage controlled oscillator;
   reference oscillator input means for receiving the reference signal produced by said reference oscillator;
   phase detector means having a first comparator input and a second comparator input, said phase detector means being operable to compare the frequency of the signal provided to said first comparator input with the frequency of the signal provided to said second comparator input and to produce an output signal which is related to the difference in frequency between the signals provided to said first and second comparator inputs;
   first divider means for coupling said reference oscillator input means with said second comparator input of said phase detector means, said first divider means being operable to divide the received reference signal by a constant determined by at least a portion of said tuning data before providing this signal to said second comparator input of said phase detector means;
   second divider means for coupling said VCO input means with said first comparator input of said phase detector means, said second divider means being operable to divide the received output from said voltage controlled oscillator by a constant determined by at least a portion of said tuning data before providing this signal to said first comparator input of said phase detector.

18. The universal frequency synthesizer of claim 17 wherein said input means is comprised of
   a shift register having a data input for receiving said tuning data and a clock input for receiving clock pulses, and
   switch means having an enable input for receiving an external enable signal, a clock input for receiving external clock pulses and a single output coupled with the clock input of said shift register, said switch means being operable to pass clock pulses to the clock input of said shift register if an enable signal is being applied to said enable input.

19. The universal frequency synthesizer as in claim 18 wherein said input means includes a latch element having a stored input, said latch element being electrically coupled with said shift register and operable to permanently stored therein tuning data from said shift register in response to a stored signal applied to said stored input.

20. The universal frequency synthesizer as in claim 17 wherein said first divider means is comprised of a counter having a maximum count state determined by at least a portion of said tuning data, said counter being coupled with said VCO input means so that said counter is clocked by the received output signal from said voltage controlled oscillator, said counter being operable to be preset to a count state determined by at least a portion of said tuning data upon obtaining its zero count state.

21. The universal frequency synthesizer as in claim 17 wherein said first divider means is comprised of
    a first counter having a maximum count state determined by at least a portion of said tuning data, said first counter being operable to produce a preset signal upon obtaining its zero count state and of responding to said reset signal by being preset to a count state determined by at least a portion of said tuning data,
    a second counter having a maximum count state determined by at least a portion of said tuning data, said second counter being operable to inhibit its output upon obtaining its zero count state and operable to respond to said preset signal by being preset to a count state determined by at least a portion of said tuning data,
    a third counter having a variable maximum count state which is controlled by the condition of said second counter, said third counter being coupled with said VCO input means so as to be clocked by the received output signal from said voltage controlled oscillator,
    means for coupling said third counter with said first and second counters, and
    means for coupling said first counter with said first comparator input of said phase detector means.

22. The universal frequency synthesizer as in claim 17 wherein said first divider means is comprised of
    a first counter having a maximum count state $C_1$ which is determined by at least a portion of said tuning data,
    a second counter having a maximum count state of $C_2$ which is determined by at least a portion of said tuning data,
    a third counter having a first maximum count state $C_3$ and a second maximum count state $C_4$, said maximum count state of said third counter being controlled by the condition of said second counter, and
    wherein said first, second and third counters are coupled with each other so as to provide a total division ratio defined by the equation:

Division Ratio $= C_4 C_2 + C_3 (C_1 - C_2)$.

23. The universal frequency synthesizer as in claim 17 wherein said second divider means is comprised of
    counting means for dividing the received reference signal by a plurality of different constants,
    decoding means for selecting in accordance with at least a portion of said tuning data the constant to be used by said counting means, and
    means for coupling said counting means with said second comparison input of said phase detector.

24. A method for selecting the frequency of an output signal produced by a voltage controlled oscillator operable to generate an output signal having a frequency related to a voltage signal applied to the control input of said voltage controlled oscillator, said method comprising the steps of:
    obtaining tuning data from an external source,
    receiving the output signal from said voltage controlled oscillator,
    obtaining a reference signal having a preselected frequency from an external reference oscillator,
    dividing the received output signal from said voltage controlled oscillator by a constant determined by at least a portion of said tuning data to thereby produce a comparison signal,
    comparing the frequency of said comparison signal with the frequency of the received reference signal,
    generating an output signal related to the difference in the frequency of said comparison signal and the received output signal from said voltage controlled oscillator, and
    using said output signal to vary the frequency of the output signal generated by said voltage controlled oscillator so as to reduce any difference in the frequency of said first comparison signal and the received output signal from said voltage controlled oscillator.

25. The method as in claim 24 wherein said step of dividing the received output signal from said voltage controlled oscillator by a constant determined by at least a portion of said tuning data to thereby produce a comparison signal comprises the steps of
    dividing the received output signal from said voltage controlled oscillator by a first constant to generate clock pulses,
    counting said clock pulses,
    dividing the received output signal from said voltage controlled oscillator by a second constant once a first preselected number of clock pulses have been counted, said first preselected number being determined by at least a portion of said tuning data,
    producing an output pulse once a second preselected number of clock pulses have been counted, said second preselected number of clock pulses being determined by at least a portion of said tuning data, and
    using said output pulse to produce said comparison signal.

26. A method for selecting the frequency of the signal produced by a voltage controlled oscillator operable to generate an output signal having a frequency related to a voltage signal applied to the controlled input of said voltage controlled oscillator, said method comprising the steps of:
    obtaining tuning data from an external source,
    receiving the output signal from said voltage controlled oscillator,
    obtaining a reference signal having a preselected frequency from an external reference oscillator,
    dividing said reference signal by a constant determined by at least a portion of said tuning data to thereby produce a comparison signal,
    comparing the frequency of said comparison signal with the frequency of the received output signal from said voltage controlled oscillator, generating a voltage signal having a voltage related to the difference in frequency between said comparison signal and the received output signal from said voltage controlled oscillator, and using said voltage signal to vary the frequency of the output signal from said voltage controlled oscillator so as to reduce the difference in frequency between said comparison signal and said reference signal.

27. A method for selecting the frequency of the signal produced by a voltage controlled oscillator operable to generate an output signal having a frequency related to a voltage signal applied to the control input of said voltage controlled oscillator, said method comprising the steps of:

obtaining tuning data from an external source, receiving the output signal from said voltage controlled oscillator, obtaining a reference signal having a preselected frequency from an external reference oscillator, dividing the received output signal from said voltage controlled oscillator by a constant determined by at least a portion of said tuning data to thereby produce a first comparison signal, dividing said reference signal by a second constant determined by at least a portion of said tuning data to thereby produce a second comparison signal, comparing the frequency of said first comparison signal with the frequency of said second comparison signal, generating a voltage signal having a voltage related to the difference in frequency of said first comparison signal and said second comparison signal, and using said voltage signal to vary the frequency of the output signal from said voltage controlled oscillator so as to reduce the difference in the frequency of said first and second comparison signal.

* * * * *